United States Patent
Kesil et al.

(10) Patent No.: US 6,831,287 B2
(45) Date of Patent: Dec. 14, 2004

(54) METHOD AND APPARATUS FOR PREVENTING TRANSFER OF AN OBJECT HAVING WRONG DIMENSIONS OR ORIENTATION

(75) Inventors: Boris Kesil, San Jose, CA (US); David Margulis, Campbell, CA (US); Elik Gershenzon, Daly City, CA (US)

(73) Assignee: MultiMetrixs, LLC, Santa Clara, CA (US)

( * ) Notice: Subject to any disclaimer, the term of this patent is extended or adjusted under 35 U.S.C. 154(b) by 0 days.

(21) Appl. No.: 09/976,890

(22) Filed: Oct. 15, 2001

(65) Prior Publication Data

US 2003/0071198 A1 Apr. 17, 2003

(51) Int. Cl.$^7$ .............................................. G01N 21/86
(52) U.S. Cl. .............................. 250/559.3; 250/559.15; 356/638
(58) Field of Search ..................... 250/559.12, 559.13, 250/559.14, 559.15, 559.19, 442.11, 559.29, 559.03, 559.36, 559.37, 559.45, 221

(56) References Cited

U.S. PATENT DOCUMENTS

| | | | |
|---|---|---|---|
| 4,559,452 A | * 12/1985 | Igaki et al. ............ | 250/559.36 |
| 5,483,138 A | 1/1996 | Shmookler et al. .... | 318/568.16 |
| 5,740,062 A | 4/1998 | Berken et al. ......... | 364/478.06 |
| 6,209,220 B1 | 4/2001 | Raaijimakers ................. | 34/66 |

\* cited by examiner

*Primary Examiner*—David Porta
*Assistant Examiner*—Stephen Yam
(74) *Attorney, Agent, or Firm*—I. Zborovsky

(57) ABSTRACT

The invention describes an apparatus for preventing gripping of objects having wrong dimensions or orientation. The apparatus comprises a part handler, e.g., a holder for parts to be treated in a chemical reactor, where the parts has to be transferred from a working position to a temporary storage. The holder may have different shapes, e.g., rectangular, elliptical, or circular, and is provided with positioning openings or recesses for engagement with pins or semispherical elements on the engaging surface of the part handler. The apparatus is provided with at least two through beam optical sensor units with adjustable divergence of the light beams emitted from the light emitting to the light-receiving element. The sensor units are located near the edge area of the holder. Position of the holder for aligning with the part handler is determined by combined interaction of the holder edge with the sensor units so that, depending on overlapping of one or two sensors and on the position of the overlapped zone, the apparatus determines whether or not the holder is aligned with the part handler or the gripping operation has to be rejected. In another embodiment the apparatus is equipped with three optical sensors, which simplify the control operation.

2 Claims, 7 Drawing Sheets

METHOD AND APPARATUS FOR PREVENTING TRANSFER OF AN OBJECT HAVING WRONG DIMENSIONS OR ORIENTATION

FIELD OF THE INVENTION

The present invention relates to the field of material handling, in particular to a method and apparatus for preventing transfer of objects having wrong dimensions or orientation. The invention may find use in systems utilizing part handlers for gripping, transporting, and unloading objects in the hard-to-get or completely inaccessible areas, such as zones inside chemical reactors, interiors of vacuum chambers, or shielded areas for manipulations with radioactive substances.

BACKGROUND OF THE INVENTION

One of the major methods for manipulating objects in special environments, such as interiors of chemical reactors, vacuum chambers, or shielded zones for manipulating radioactive substances, is the use of part handlers or grippers for grasping, holding, moving, and positioning of objects. In some cases, a part handler does not manipulate the parts directly but rather handle intermediate pallets, holders, or plates, which support the parts to be processed. For example, a part to be treated inside a chemical reactor can be transported to a temporary storage to free the reactor for another operation. Upon completion of this operation, the part handler returns the pallet or a holder to the chemical reactor for further processing.

For example, U.S. Pat. No. 6,209,220 issued in 2001 to Ivo Raaijmakers discloses a device for cooling substrates in a semiconductor processing system, e.g., in a cluster tool. According to one embodiment, a separate plate of a material with good heat-conductive properties is kept cool within a pocket of the cluster tool chamber during processing and is moved closer to the substrate for use as a heat sink. The cooling plate is moved into and out of the aforementioned pocket in a lateral direction, or the wafer support is raised towards the cooling plate in a vertical direction.

In the case when a part or a part-supporting holder, such as an elliptical, rectangular, or circular plate, participates in a technological process and has to be transferred from one position to another by a part handler or another part handler, it should be provided with means for accurate placement into the initial position from which is has been transferred to the temporary storage. In the case the alignment is not achieved and the part or a holder is gripped and returned to a wrong position, this may lead to crash of the part or lead to serious damage of the equipment.

One alignment or centerfinding system is described in U.S. Pat. No. 5,483,138 issued to S. Shmookler, et al., in 1996. The aforementioned system uses four photoelectric position sensors to locate the center of a wafer as the wafer is moved between chemical reactors. An array of optical sources is disposed above the central wafer transport chamber and a corresponding array of optical detectors is disposed below the chamber. The illustrated sensor array allows the identification of wafer positions, but requires that the wafer transport chamber be optically accessible from both the top and the bottom of the chamber. This photoelectric sensor array is arranged so that the light travels along a path generally perpendicular to the plane in which the wafer is transported. In practice, this type of sensor geometry may lead to erroneous position information due to multiple reflections from the surfaces of the top and bottom chamber covers and from the wafer. To compensate for such erroneous position data, the Shmookler system samples more data points than necessary, discarding data that does not fall within expected limits.

The Shmookler system uses a data collection scheme, which relies on particular points on the edge of a wafer crossing the four-sensor array in a particular order. This scheme works well when wafers are positioned near to their nominal position. However, wafers that are in danger of breaking in the course of a transport operation may be dislodged from their nominal position by a large amount. For such substantially misaligned wafers, the Shmookler system will not appropriately identify the wafer position, and wafers that are substantially out of position may consequently be broken.

U.S. Pat. No. 5,740,062 issued in 1998 to Berken, et al., which is aimed at elimination of disadvantages inherent in the Shmookler system, discloses a wafer positioning system which determines the position of a wafer during processing by monitoring the position of the wafer transport robot as the robot transports the wafer by one or more position sensors. The wafer positioning system incorporates a transparent cover on the surface of the wafer handling chamber and two optical position sensors disposed on the surface of the transparent cover. The position sensors direct light through the wafer-handling chamber to reflectors near the floor of the chamber, which reflect the light back to the position sensors. A detector within the position sensor detects when the beam path from the position sensor to the reflector is uninterrupted. As wafers are transported through the chamber, the edge of the transported wafer interrupts the position sensor beam path causing the output of the position sensor to switch states. When the position sensor output switches, the position of the wafer transport robot is measured. At least two data points are measured to establish the wafer position. If the wafer is not at its nominal position, the position of the wafer transport robot is adjusted to compensate for the wafer misalignment.

A main disadvantage of all known systems described above consists in that they cannot operate with parts subject to change in dimensions. For example, after multiple participations in sputtering or chemical processes, a carrier or part handler may change the outer diameter due to deposition of sputtered materials or due to etching. If the carrier is aligned with the use of positioning pins and openings and the position is controlled by sensing the edge of the object having a given diameter for finding the center of the object, such a method may lead to miscalculations in centerfinding. This is because the diameter is changed. As a result, the positioning pins will not be aligned with the openings, so that the handler will not return to its correct initial position, or the part supported by the carrier will be picked up in a wrong position. As mentioned above, this may lead to serious problems.

OBJECTS OF THE INVENTION

It is an object of the invention to provide an apparatus for preventing handling of objects having wrong dimensions or orientation. Another object is to provide an apparatus for automatically stopping an operation of gripping of misaligned parts with a parts handler. Still another object is to provide an apparatus capable of centering objects with variable dimensions. A further object is to provide an apparatus of the aforementioned type which is simple in construction, inexpensive to manufacture, does not involve calculations for determining the central position of the object, and can be easily built into an existing system. Still another object is to provide a method for preventing gripping of objects having wrong dimensions or orientation.

SUMMARY OF THE INVENTION

The invention describes an apparatus for preventing gripping of objects having wrong dimensions or orientation. The apparatus comprises a part handler, e.g., a holder for parts to be treated in a chemical reactor, where the parts has to be transferred from a working position to a temporary storage. The holder may have different shapes, e.g., rectangular, elliptical, or circular, and is provided with positioning openings or recesses for engagement with pins or semispherical elements on the engaging surface of the part handler. The apparatus is provided with at least two through beam optical sensor units with adjustable divergence of the light beams emitted from the light emitting to the light-receiving element. The sensor units are located near the edge area of the holder. Position of the holder for aligning with the part handler is determined by combined interaction of the holder edge with the sensor units so that, depending on overlapping of one or two sensors and on the position of the overlapped zone, the apparatus determines whether or not the holder is aligned with the part handler or the gripping operation has to be rejected. In another embodiment the apparatus is equipped with three optical sensors, which simplify the control operation.

DETAILED DESCRIPTION OF THE INVENTION

Figure 1A:
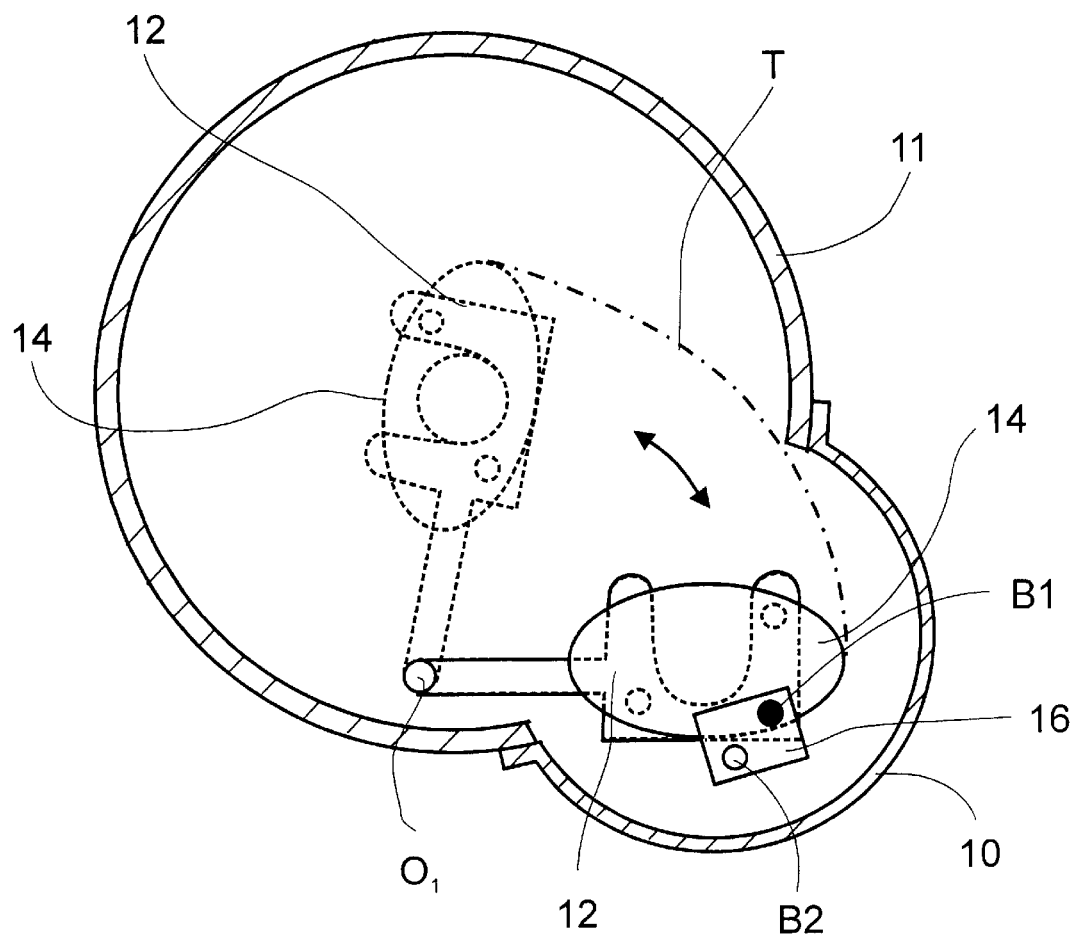
FIG. 1A is a transverse sectional view of an apparatus of the invention with a chemical reactor having a storage chamber in the form of a hollow casing for temporary storing a part in a non-operating position.
Figures 1B, 1C, 1D, 1E:
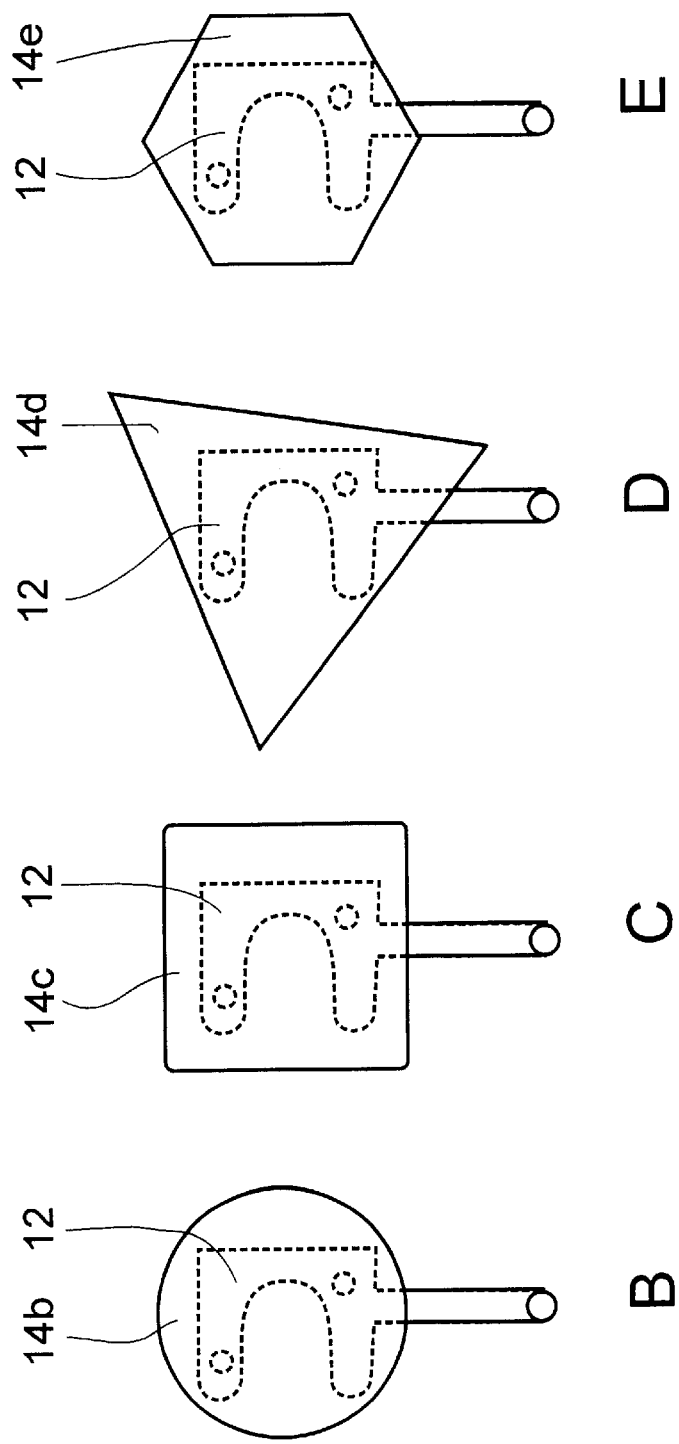
FIGS. 1B–E are top views of part handlers having circular, rectangular, triangular, and polygonal configurations, respectively.

FIG. 1A is a top view of a semicircular hollow casing 10 having a lateral location with respect to a processing chamber, such as a hermetically sealed chemical reactor 11. Reference numeral 14 designates an elliptical object, e.g., a holder for parts to be treated inside the chemical reactor 11. The holder 14 has to be transferred, together with the parts, to another location, such as a pocket of the casing 10, by means of a part handler 12. Temporary release of the working space of the chemical reactor 11 from the holder 14 may be required, e.g., for replacing reagents. Reference numeral 16 designates through-beam optical sensor units (not shown in FIG. 1A) for detecting positions of the edge of the holder 14.

Position of the part handler 14 in the chemical reactor 11 is shown in FIG. 1A by a broken line 14'.

As can be seen from FIGS. 1B–E, which are top views of part handlers 14b, 14c, 14d, and 14e, they may have circular, rectangular, triangular, and polygonal configurations, respectively.

Figure 2:
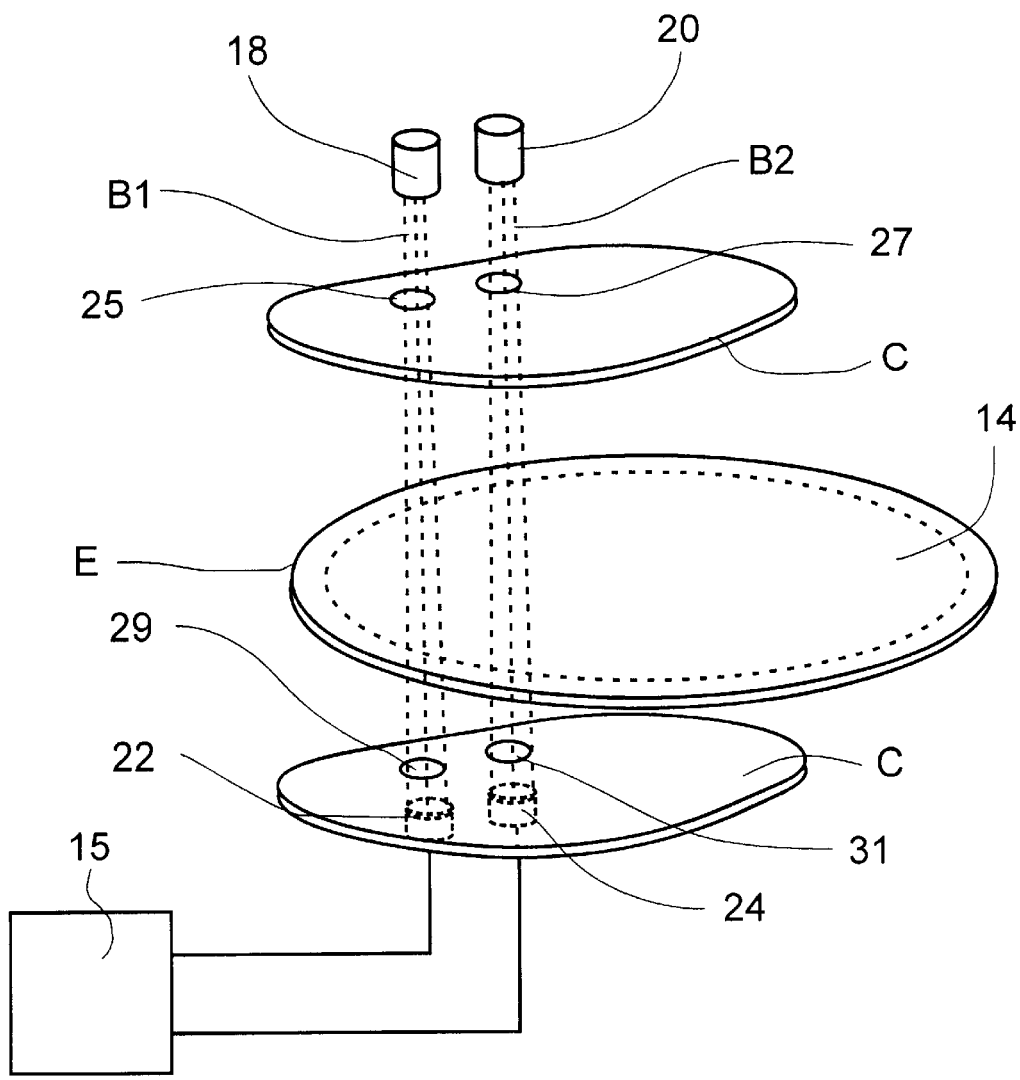
FIG. 2 is a view illustrating more detailed position of the sensors in the system.

More detailed position of the sensors in the system 16 is shown in FIG. 2. It can be seen that the optical sensor unit 16 consists of a pair of light-emitting elements 18 and 20, such as laser diodes, and a pair of respective light-receiving elements 22 and 24, such as photosensors. The light-emitting and light-receiving elements are located so that the beams B1 and B2 emitted from the laser diodes 18 and 20 pass near the edge of the holder 14. The apertures of the beams B1 and B2 emitted from the laser diodes 18 and 20 is sufficiently narrow for improving sensitivity and positioning accuracy in detecting the position of the holder edge E (FIG. 2).

Figure 3:
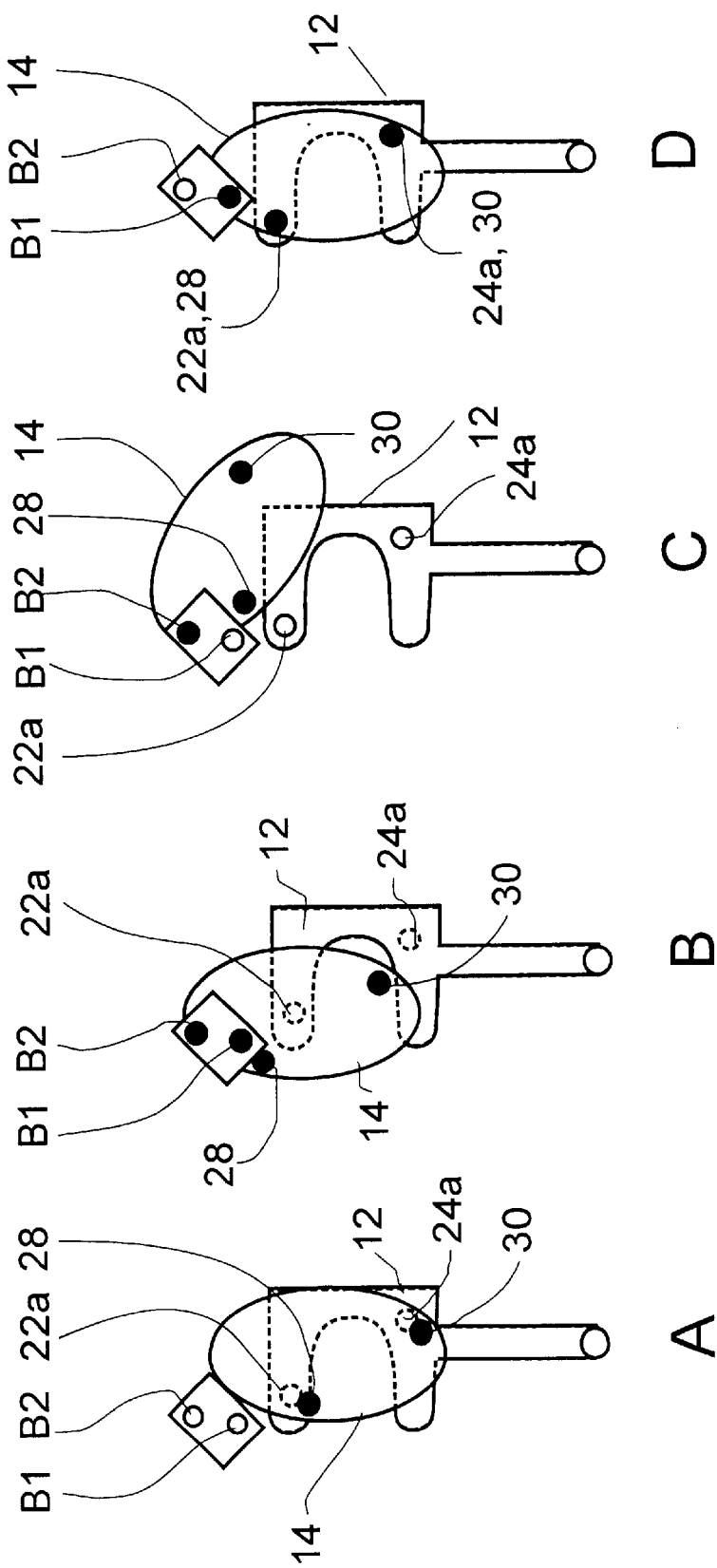
FIG. 3 is plan views illustrating various possible mutual positions of the holder, the part handler, the optical sensor unit, and centering elements.

FIG. 3 shows plan views for various possible mutual positions of the holder 14, the part handler 12, the optical sensor unit 16, and centering elements in the form of positioning openings or recesses 22, 24 on the holder 14 and semispherical elements 28, 30 on the engaging surface of the part handler 12. The aforementioned components are shown inside the pocket of the casing 10 after transfer of the holder 14 from the chemical reactor 11 (FIG. 1). In FIG. 3, the black and white circles show light beams B1 and B2 emitted from respective laser diodes 18 and 20 (FIG. 2). The black circles correspond to the photodiodes, which are blocked by the edge E of the wafer holder 14, and the white circles correspond to those photodiodes which sense the light beams B1 and B2 emitted from the laser diodes.

FIG. 3A illustrates a condition in which none of the beams B1 and 82 is overlapped by the contours of the holder 14, so that both photodiodes 22 and 24 (FIG. 2) sense the light. Under this condition (hereinafter referred to as Condition 1), none or only one of the recesses 22, 24 are aligned with respective semispherical elements 28, 30. As a result, the apparatus receives a command that rejects gripping of holder 14 with the part handler 12. The absence of the holder 14 in the pocket of the casing 10 also corresponds to the above condition (none of the recesses 22, 24 is aligned with respective semispherical elements 28, 30).

FIG. 3B illustrates a condition in which both beams B1 and B2 are overlapped by the contours of the holder 14, so that both photodiodes 22 and 24 (FIG. 2) do not sense the light. Under this condition (hereinafter referred to as Condition II), none or only one of the recesses 22a, 24a are aligned with respective semispherical elements 28, 30. As a result, the apparatus receives a command that rejects gripping of circular casing 10 with the part handler 12.

FIG. 3C illustrates a condition in which the beam B1 is not overlapped by the contours of the holder 14 and is sensed by the photodiodes 22 (FIG. 2). The light of the beam B2 is overlapped by the edge E of the wafer holder 14 so that this beam is not sensed by the photodiode 24. Under this condition (hereinafter referred to as Condition III), none or only one of the recesses 22a, 24a are aligned with respective semispherical elements 28, 30. As a result, the apparatus receives a command that rejects gripping of circular casing 10 with the part handler 12.

FIG. 3D illustrates a condition in which the beam B2 is not overlapped by the contours of the holder 14 and is sensed by the photodiodes 24 (FIG. 2). The light of the beam B1 is overlapped by the edge E of the wafer holder 14 so that this beam is not sensed by the photodiode 22. Under this condition (hereinafter referred to as Condition IV), both recesses 22, 24 are aligned with respective semispherical elements 28, 30. As a result, the apparatus receives a command that enables operation of handling of the elliptical holder 14. Such a handling operation may consists of transferring the part handler 12 with parts (not shown) from the operation position in the chemical reactor 11 to the pocket of the casing 10, or of transferring the holder 14 by the part handler 12 back to the chemical reactor 11 from the casing 10.

Let us assume that all sensors (18, 22) and (20, 24) are in correct positions and that the part handler 12 transfers the holder 14 between the chemical reactor 11 and the casing 10 with a correct cycle. Let us assume that within the chemical reactor 11 the parts (not shown) are coated with a coating film applied by liquid-phase deposition. Since the holder 14 is also located in the chamber 11 during deposition, precipitated particles are also applied onto the surfaces of the holder 14, so that after multiple cycles the outer diameter of the holder 14 will be increased to such an extent that after being placed into the pocket of the casing 10, the center of the circular holder 14 will be shifted. As a result, one of two recesses 22a, 24a may not coincide with two of respective semispherical elements 28, 30.

If the part handler 12 pickups and transfers the holder 14 with the part in a wrong position (i.e., with misalignment of at least one semispherical element with a respective recess), this may lead to serious problems.

Figure 4:
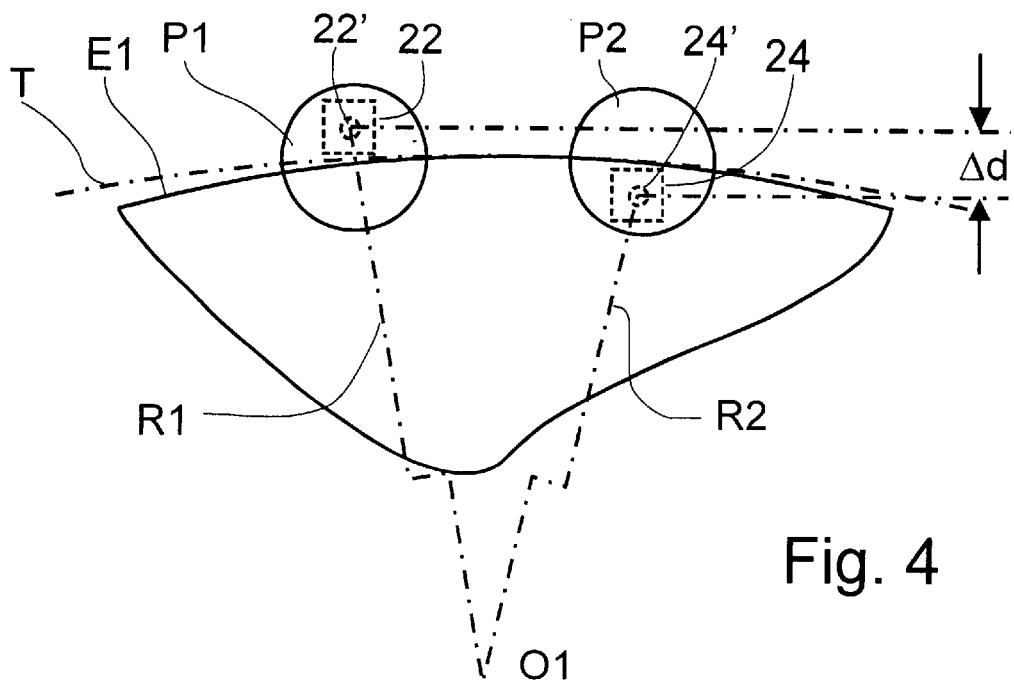
FIG. 4 is a plan view of two photodiodes within projections of respective beams during normal operation with the dimensions of the holder within the allowed tolerances.

It is understood that accuracy of positioning control to a great extent depends on a mutual position of the photodiodes 22 and 24. FIG. 4 is a plan view of two photodiodes 22 and 24 within projections P1 and P2 of respective beams B1 and B2. The areas of projections P1 and P2, which correspond to sensitivity of the photodiodes, are hatched. The scenario of FIG. 4 corresponds to the aforementioned Condition IV, i.e., the part handler 12 is allowed to pick up and transfer the holder 14 between the operation positions. As the part handler 12 performs circular movements around the center of rotation O1 of the part handler 12, each point on the holder 14 taken by the part handler 12 also performs circular movements from and into the chemical reactor 11 (FIG. 1A). Thus, in the view of FIG. 4, the outermost point E1 on the edge of the holder 14 describes a circular trajectory T which, for normal operation of the apparatus, should always pass between input apertures 22' and 24' of both photodiodes diode 22 and 24 so that the input aperture 22' is located outside and the input aperture 24' is located inside the aforementioned circular trajectory T (FIG. 1A).

Figure 5:
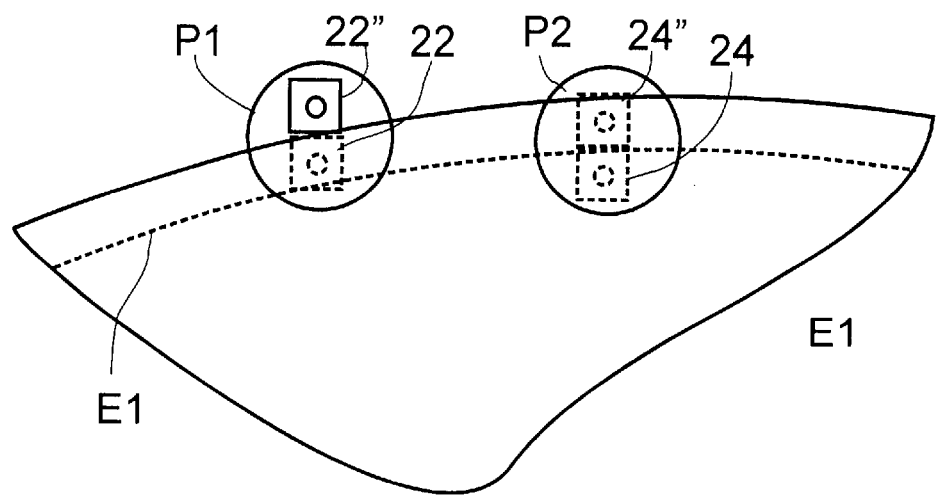
FIG. 5 is a plan view of two photodiodes within projections of respective beams when the dimensions of the holder go beyond the allowed tolerances.

In FIG. 4, symbol Δd, which is a tolerance for relative positions of the photodiodes 22 and 24, is equal to a difference between the lengths of the radii R2 and R1 from the center O1 to the centers of respective input apertures 22 and 24. Imagine now that, after participation in multiple cycles of sputtering, the outer diameter of the holder 14 has increased to the extent that after transfer of the holder 14 to the casing 10 by normally operating part handler 12, the edge E of the holder 14 will assume a position with respect to the photodiodes 22 and 24 shown FIG. 5. In other words, the Condition II described in connection with FIG. 3B will occur. When such condition occurs, the photodiodes 22 and 24 will send appropriate commands to the actuating mechanisms 15 of the part handler 12 to stop the operation until the photodiodes 22 and 24 will be moved to new operation positions shown by references 22" and 24" in FIG. 5.

Figure 6:
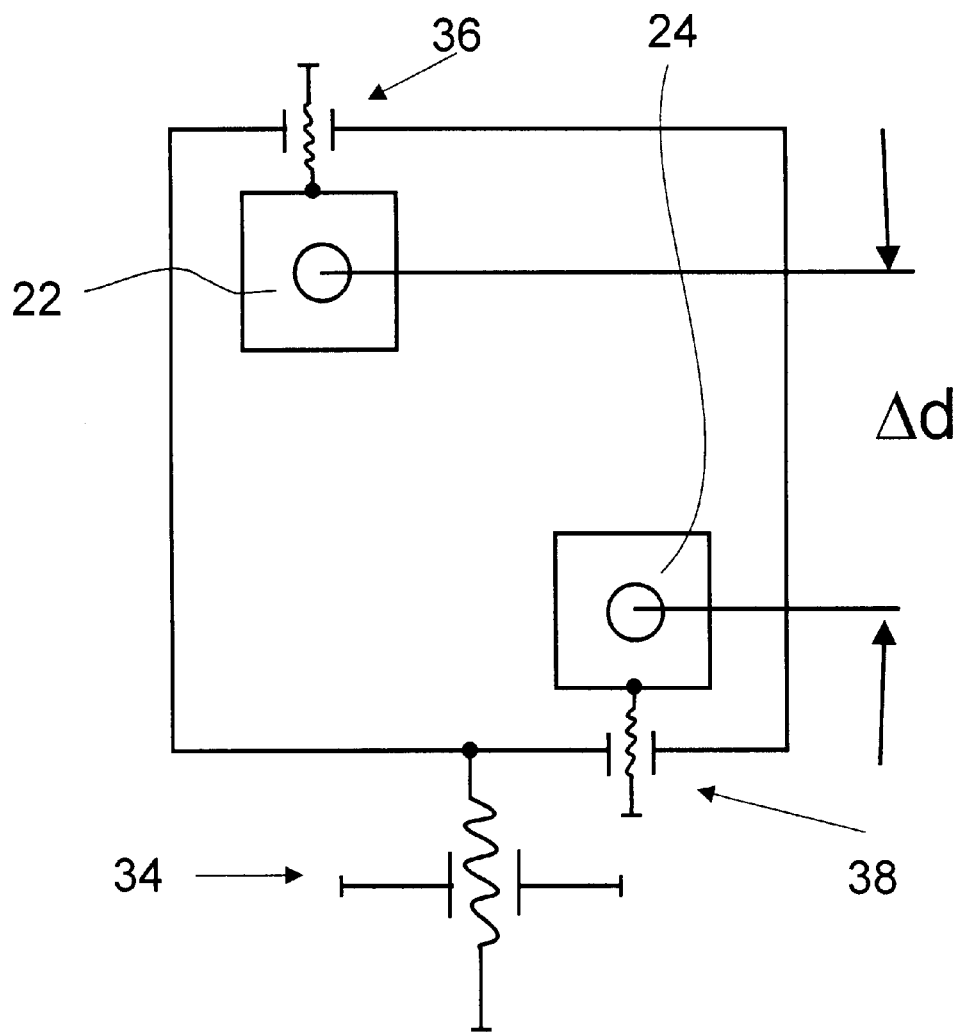
FIG. 6 is a schematic view of mechanisms suitable for adjusting positions of the photodiodes with respect to the edge of the holder as well as with respect to each other.

FIG. 6 is a schematic view of mechanisms suitable for adjusting positions of the photodiodes 22 and 24 with respect to the edge E of the holder 14 as well as with respect to each other. With an increase in the diameter of the holder 14, both photodiodes 22 and 24 can be moved radially outwardly from the position of FIG. 5 to the position of FIG. 4 by means of a threaded mechanism 34. If it necessary to adjust the value of the tolerance Δd, one or both photodiodes 22 and 24 can be adjusted by means of threaded mechanisms 36 and 38.

It is understood that photodiodes 22 and 24 should always remain within projections P1 and P2 of respective beams B1 and B2. In FIG. 4 the projections P1 and P2 of respective beams B1 and B2 are shown circular. This is because, without the use of special optics, the cross-sections of the beams emitted from the laser diodes 18 and 20 are circular.

Figure 7:
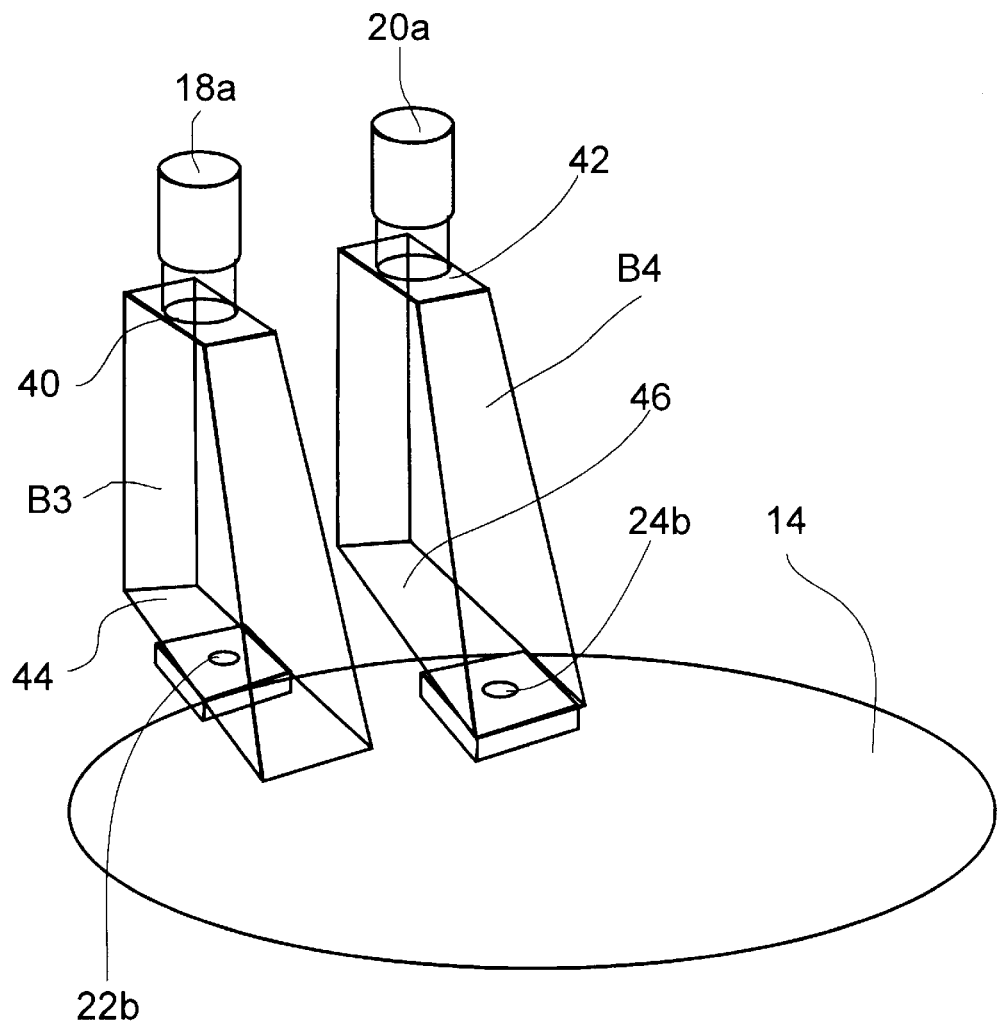
FIG. 7 shows an embodiment of an optical system of the apparatus of the invention, which allows a wide-range broadening of the limits for adjusting the positions of the photodiodes.

FIG. 7 shows an embodiment of an optical system of the apparatus of the invention which allows a wide-range broadening of the limits for adjusting the positions of the photodiodes 22b and 24b and, hence, of the dynamic range of operation of the apparatus. In other words, the holders handled by the part handler 12 may be essentially different is size and shape. This is achieved by passing the beams B3 and B4 through cylindrical lenses 40 and 42 installed at the output aperture of the laser diodes 18a and 20a, respectively. In this case the cross-sections of the beam are turned into narrow strips 44 and 46. The adjustment is reduced to moving the photodiodes 22a and 24a.

Thus, it has been shown that the invention provides an apparatus for protecting a part handler from gripping objects having wrong dimensions or orientation. The apparatus automatically stops the operation of picking up misaligned objects with a part handler and allows centering of objects with variable dimensions. The apparatus is simple in construction, inexpensive to manufacture, does not involve calculations for determining the central position of the object, can be easily built into an existing system, and is suitable for use in conjunctions with chemical reactor, vacuum chambers, pressurized areas, and shielded areas for handling radioactive substances. The invention also provides a method for protecting a part handler from gripping objects having wrong dimensions or orientation.

Although the invention has been shown and described with reference to specific embodiments, it is understood that these embodiments should not be construed as limiting the areas of application of the invention and that any changes and modifications are possible, provided these changes and modifications do not depart from the scope of the attached patent claims. For example, three laser diodes with three photosensors can be used instead of two pairs. A lights source may be different from the laser diodes. Mechanisms for adjustment of the positions of photodiodes may be different from the threaded mechanisms of FIG. 6 and can be controlled from the photodiodes via feed back for automatic adjustment. The part handler may comprise an end effector for gripping circular objects. The casing may comprise a pallet used in an assembling line for carrying various parts. The objects may change the dimensions not only into direction of increase, but also into direction of decrease, e.g., as a result of etching. The contour of the object that overlaps the beams of the optical control system may be the contours of the inner opening instead of the outside periphery. Light sources may be located under the object, and the photodiode may be located above the object.

What we claim is:

1. A method for preventing transfer of an object having wrong dimensions or orientation comprising:

providing an apparatus for transfer of said object between a first fixed position and a second fixed position, said object having a contour, said contour changing dimensions so that orientation of said contour with respect to said first light receiving element and said second light-receiving element is changed, said apparatus having object carrying means, object receiving means, first fixation means on said object for fixation of said object, second fixation means in said receiving means engageable with said first fixation means for fixing said object in said second fixed position; and optical position control means for controlling correctness of said object in said second fixed position, said optical position means being provided with a first optical position control means comprising a first light source emitting a first light beam and a first light-receiving element that senses said first light beam, and a second optical position control means comprising a second light source for emitting a second light beam and a second light-receiving element for sensing said second light beam;

locating said first light source and said first light-receiving element on the opposite sides of said object;

locating said second light source and said second light-receiving element on the opposite sides of said object;

locating said first light-receiving element so that in a projection of said first light beam onto said first-light receiving element said first light-receiving element is located outside said contour;

locating said second light-receiving element so that in a projection of said second light beam onto said second-light receiving element said second light-receiving element is located inside said contour;

picking up said object by said object carrying means from said first fixed position and inserting said object into said object receiving means in said second fixed position;

checking by said first light-receiving element that said first light beam is overlapped by said contour;

checking by said second light-receiving element that said second light beam is not overlapped by said contour and is sensed by said second light-receiving element; and stopping operation of said object carrying means if conditions of said both checking steps is not fulfilled;

providing said first light-receiving element and said second light-receiving element with means for adjusting positions of said first light-receiving element and said second light-receiving element with respect to said contour; and adjusting positions of said first light-receiving element and said second light-receiving element with respect to said contour when conditions of said steps of checking is not fulfilled until said condition is satisfied.

2. The method of claim 1, further comprising the step of broadening said projection of said first light beam and said projection of said second light beam by installing a cylindrical lens in the outlet aperture of each of said light sources.

* * * * *